United States Patent
Takimoto et al.

(10) Patent No.: US 6,380,603 B1
(45) Date of Patent: Apr. 30, 2002

(54) PHOTOSENSITIVE DEVICE WITH INTERNAL CIRCUITRY THAT INCLUDES ON THE SAME SUBSTRATE

(75) Inventors: Takahiro Takimoto, Tenri; Toshihiko Fukushima, Nara; Isamu Ohkubo, Kashiba; Makoto Hosokawa, Tenri; Masaru Kubo, Kitakatsuragi, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/707,158

(22) Filed: Nov. 7, 2000

(30) Foreign Application Priority Data

Nov. 8, 1999 (JP) .............................. 11-317491

(51) Int. Cl.⁷ .......................... H01L 31/06; H01L 29/00
(52) U.S. Cl. ...................... 257/463; 257/461; 257/465; 257/544
(58) Field of Search ................................ 257/461, 463, 257/465, 544

(56) References Cited

U.S. PATENT DOCUMENTS

| | | | |
|---|---|---|---|
| 5,177,581 A | | 1/1993 | Kubo et al. |
| 5,283,460 A | * | 2/1994 | Mita ........................... 257/432 |
| 5,418,396 A | * | 5/1995 | Mita ........................... 257/461 |
| 5,466,962 A | | 11/1995 | Yamamoto et al. |
| 5,602,415 A | | 2/1997 | Kubo et al. |
| 5,825,071 A | * | 10/1998 | Takakura ..................... 257/440 |
| 6,005,278 A | | 12/1999 | Fukunaga et al. |
| 6,049,117 A | * | 4/2000 | Fukunaga et al. .......... 257/446 |
| 6,114,740 A | * | 9/2000 | Takimoto et al. ........... 257/461 |
| 6,127,715 A | | 10/2000 | Yamamoto et al. |

FOREIGN PATENT DOCUMENTS

| | | |
|---|---|---|
| JP | 9-219534 | 8/1997 |
| JP | 10-209411 | 8/1998 |
| JP | 10-284753 | 10/1998 |
| JP | 2875244 | 1/1999 |

OTHER PUBLICATIONS

U.S. Patent Application of Ohkubo et al, Serial No. 09/472,886, filed Dec. 28, 1999.
U.S. Patent Application of Takimoto et al, Serial No. 09/616,961, filed Jul. 14, 2000.

* cited by examiner

*Primary Examiner*—Ngân V. Ngô
(74) *Attorney, Agent, or Firm*—Nixon & Vanderhye., P.C.

(57) ABSTRACT

A semiconductor device includes: a photosensitive section essentially composed of a PN junction between a semiconductor multilayer structure of the first conductivity type and a first semiconductor layer of the second conductivity type; and a partitioning portion for splitting the photosensitive section into a plurality of regions. The semiconductor multilayer structure of the first conductivity type includes: a semiconductor substrate of the first conductivity type; a first semiconductor layer of the first conductivity type; and a second semiconductor layer of the first conductivity type. The partitioning portion includes a third semiconductor layer of the first conductivity type extending from the first semiconductor layer of the second conductivity type so as to reach the second semiconductor layer of the first conductivity type.

8 Claims, 13 Drawing Sheets

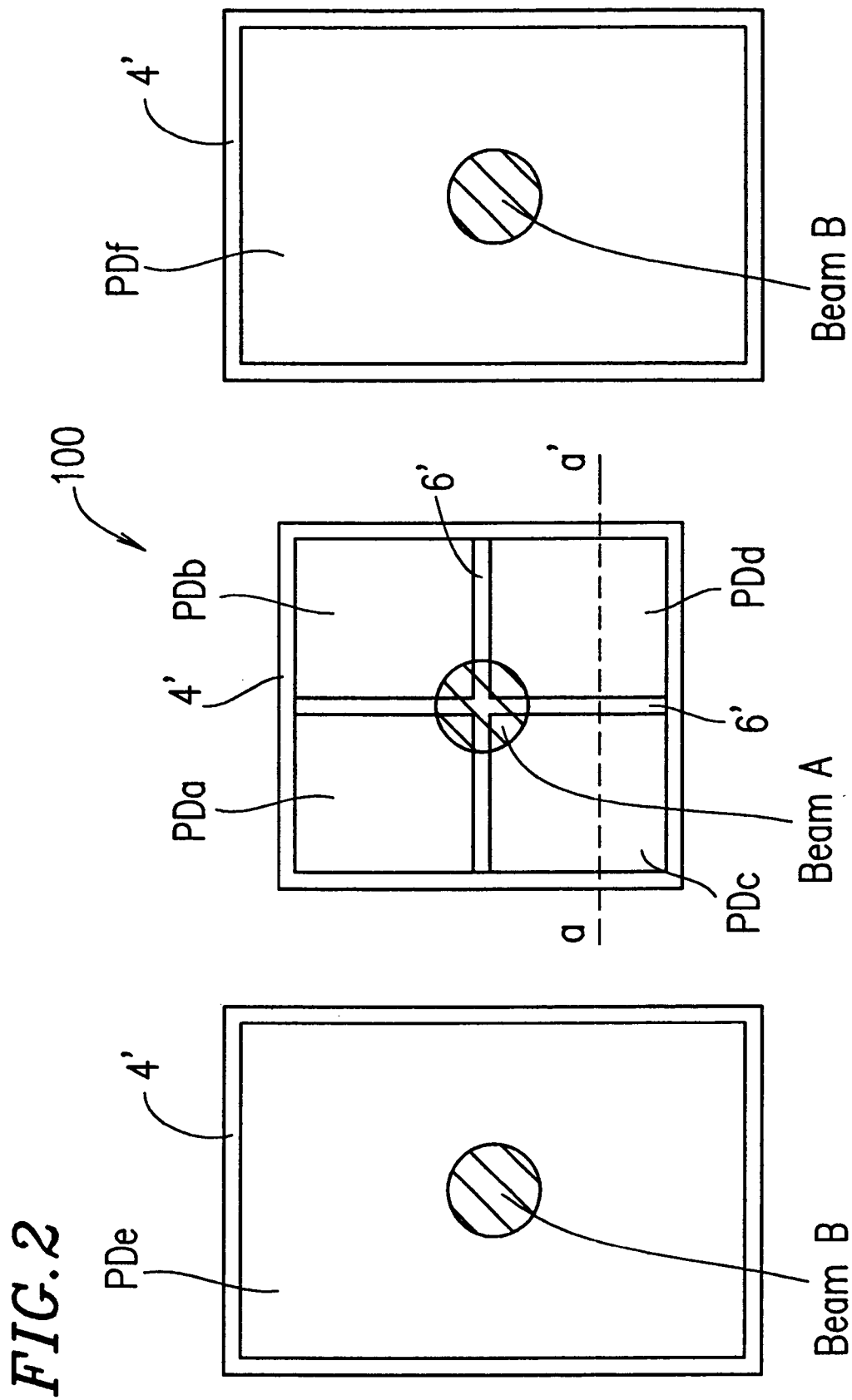

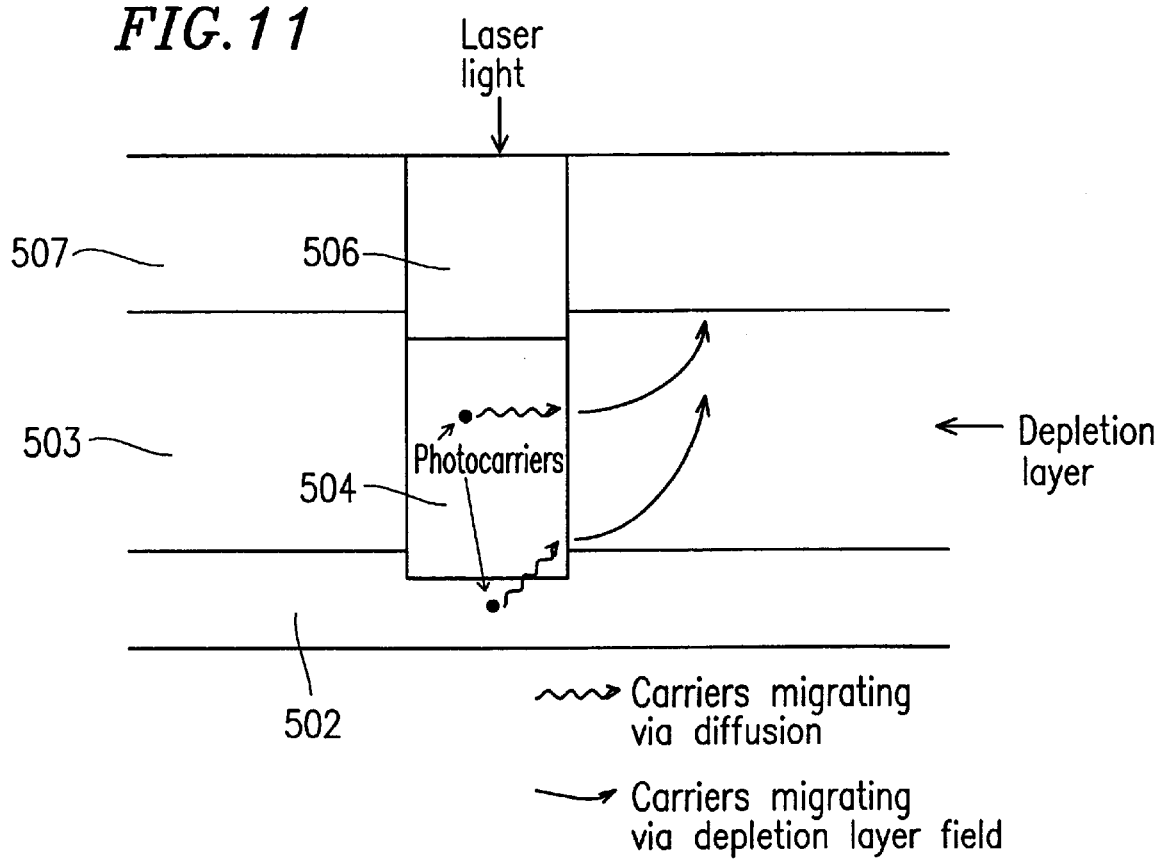

US 6,380,603 B1

PHOTOSENSITIVE DEVICE WITH INTERNAL CIRCUITRY THAT INCLUDES ON THE SAME SUBSTRATE

BACKGROUND OF THE INVENTION

1. Field of the Invention

The present invention relates to a semiconductor device, e.g., a photosensitive device with internal circuitry that includes on the same substrate both a photosensitive device for converting incident light into an electrical signal and an integrated circuit portion for processing the electrical signal which is output from the photosensitive device, and in particular to a high-performance semiconductor device incorporating a photosensitive device having an enhanced response speed; and a method for producing the same.

2. Description of the Related Art

Photosensitive devices with internal circuitry, which are composed of semiconductor devices, are employed for optical pickups, for example. In recent years, optical pickups employed in CD-ROM, CD-R/RW, or DVD-ROM drives have been increasing in operation speed, and there has been a demand for higher-performance (i.e., higher sensitivity and lower noise) photosensitive device having internal circuitry.

For example, obtaining a photosensitive device with internal circuitry having a high response speed requires at least a photodiode having rapid photoelectric conversion characteristics. In an attempt to enhance the photoelectric conversion characteristics of a photodiode, a semiconductor device shown in FIG. 9 has been proposed (Japanese Laid-Open Patent Publication No. 10-209411), for example. The semiconductor device shown in FIG. 9 includes bipolar transistors and a photodiode structural portion on a P-type semiconductor substrate 501. The photodiode structural portion includes a photodiode of a cathode-common type and a photodiode of an anode-common type. The following description will be focused on the photodiode of an anode-common type shown in FIG. 9.

A high concentration P-type embedded diffusion layer 502, an ultra-low concentration P-type epitaxial layer 503, and an N-type epitaxial layer 507 are laminated in this order on a P-type semiconductor substrate 501. In the P-type epitaxial layer 503, a P-type separation diffusion layer 504 is provided which extends from the surface of the P-type epitaxial layer 503 into the P-type embedded diffusion layer 502. A P-type embedded diffusion layer 506 is provided in the N-type epitaxial layer 507 so as to overlie the P-type separation diffusion layer 504. In accordance with this structure, split photodiodes of an anode-common type (i.e., which share the same anode portion in common), each having a rectangular shape, can be formed as shown in FIGS. 10A to 10C, for example. Herein, the P-type separation diffusion layer 504 and the P-type separation diffusion layer 506 together compose a partitioning portion which splits the four rectangular photodiode regions from one another. In order to improve the frequency characteristics of the photodiodes, it is necessary to reduce the junction capacitance and serial resistance in the first place.

In accordance with the above-described structure, the junction capacitance of concern exists between the P-type epitaxial layer 503 and the N-type epitaxial layer 507. Since the P-type epitaxial layer 503 has an ultra-low concentration, it is possible to ensure a sufficient expanse of a depletion layer from the N-type epitaxial layer 507 to the P-type epitaxial layer 503 when a reverse voltage is applied. As a result, the junction capacitance between the P-type epitaxial layer 503 and the N-type epitaxial layer 507 can be reduced. The serial resistance of concern is determined by the serial resistance of the high concentration P-type embedded diffusion layer 502 and the P-type embedded diffusion layer 504. Since both layers 502 and 504 have a high concentration and a small resistivity, their serial resistance can also be made small. The frequency characteristics of the split photodiodes can be improved in this manner.

An optical pickup is operative to track the data carried on a disk which is rotating at a fast rate, so as to read out a reproduction signal therefrom, while acquiring servo signals which are provided for facilitating the accurate reading of the data from the disk. The servo signals include a focus error signal (FES) for positioning the focal point of laser light emitted from a semiconductor laser on the disk and a radial error signal (RES) for positioning the focal point of the laser light on a certain pit (or track) on the disk. The latter positioning control is often referred to as "tracking". A number of methods exist for detecting such servo signals. As an example of a method for detecting an FES, an astigmatic method will be described below.

In order to detect an FES by the astigmatic method, it is necessary to employ four split photodiodes which have respectively different light-receiving regions. FIGS. 10A to 10C illustrate how a beam spot may appear on a photosensitive device in accordance with the astigmatic method. FIG. 10A shows the case where a focal point of laser light emitted from a semiconductor laser is on the surface of a disk, in which case the beam spot has a truly circular shape. FIGS. 10B and 10C show the cases where a focal point of laser light emitted from a semiconductor laser is in front of or behind the surface of a disk, respectively, in which cases the beam spot has an elliptical shape. The different shapes of light beams are ascribable to the use of a cylindrical lens which exerts a lens effect on only light which is polarized in a certain direction. An FES can be obtained by applying the respective output signals Sa, Sb, Sc, and Sd from the four split photodiodes PDa, PDb, PDc, and PDd (as shown in FIGS. 10A to 10C) to the following equation:

$$FES = (Sa+Sd)-(Sb+Sc),$$

where a difference between a sum of the output signals from one pair of diagonally-disposed photodiodes and a sum of the output signals from the other pair of diagonally-disposed photodiodes is derived. Different calculation results of this equation correspond to different beam spot convergence states as follows:

FIG. 10A (where the focal point of laser light is on the disk surface): FES=0

FIG. 10B (where the focal point of laser light is in front of the disk surface): FES>0

FIG. 10C (where the focal point of laser light is behind the disk): FES<0

Accordingly, by performing a feedback control so that the value of FES equals zero, the beam spot will be properly placed on the disk surface.

The state shown in FIG. 10A is also a state where a reproduction signal RF is constantly being read based on proper servo control. Hence, the reproduction signal RF can be calculated by taking a sum of the output signals Sa, Sb, Sc, and Sd from the four split photodiodes PDa, PDb, PDc, and PDd, as shown by the following equation:

$$RF = Sa+Sb+Sc+Sd.$$

In view of the aforementioned manner of using an optical pickup, it can be seen that enhancing the performance of an optical pickup in speed, sensitivity, and noise level can only be achieved through enhancing its performance in the state where laser light is incident on the partitioning portion (i.e., the P-type separation diffusion layer 504 and the P-type separation diffusion layer 506) as well as the light-sensitive portions of the split photodiodes. However, the response of the split photodiodes of an anode-common type as shown in FIG. 9 generally deteriorates when laser light is incident on the partitioning portion for the following reasons.

Laser light of a wavelength of 780 nm or 650 nm (which are typically employed for an optical pickup) would intrude into the partitioning portion of an optical pickup to a depth of about 9 µm or about 3.5 µm, respectively. The "depth" as used herein is defined as a depth at which the light intensity is reduced to 1/e that of the incident light (where e represents the base of a natural logarithm). Therefore, when laser light is incident on the partitioning portion, a large portion of photocarriers are generated in the high concentration P-type separation diffusion layer 504 or in the underlying P-type embedded diffusion layer 502. The generated photocarriers will migrate within the high concentration separation diffusion layer 502 through diffusion as shown in FIG. 11. Now, the partitioning portion needs to have a width of about 2 µm or more, for example, in order to secure a certain level of separation withstand pressure: in such cases, a distance of about 1 µm or more will be traveled by photocarriers via diffusion. The photocarrier migration via diffusion occurs more slowly than the migration which occurs via an electric field generated across the depletion layer (called the "depletion layer field"). On the other hand, when laser light is radiated in regions other than the partitioning portion of the split photodiodes, a large portion of the generated photocarriers will rapidly migrate via a depletion layer field. Thus, when light is incident on the partitioning portion of a photodiode, a signal component emerges which has a relatively slow response speed, so that the response speed will decrease as compared with the case where light is not incident on the partitioning portion.

SUMMARY OF THE INVENTION

According to one aspect of the present invention, there is provided a semiconductor device including: a semiconductor multilayer structure of a first conductivity type; a first semiconductor layer of a second conductivity type, formed on the semiconductor multilayer structure of the first conductivity type; a photosensitive section composed essentially of a PN junction between the semiconductor multilayer structure of the first conductivity type and the first semiconductor layer of the second conductivity type; and a partitioning portion for splitting the photosensitive section into a plurality of regions, wherein the semiconductor multilayer structure of the first conductivity type includes: a semiconductor substrate of the first conductivity type; a first semiconductor layer of the first conductivity type formed on the semiconductor substrate of the first conductivity type; and a second semiconductor layer of the first conductivity type formed on the first semiconductor layer of the first conductivity type, wherein the photosensitive section is formed in a region surrounded by a third semiconductor layer of the first conductivity type, the third semiconductor layer of the first conductivity type extending from a surface of the first semiconductor layer of the second conductivity type so as to reach the second semiconductor layer of the first conductivity type, and a fourth semiconductor layer of the first conductivity type is provided under the third semiconductor layer of the first conductivity type, wherein the fourth semiconductor layer of the first conductivity type overlaps with at least a portion of the third semiconductor layer of the first conductivity type, extends through the second semiconductor layer of the first conductivity type, and at least reaches the first semiconductor layer of the first conductivity type, and wherein the partitioning portion includes a fifth semiconductor layer of the first conductivity type extending from the first semiconductor layer of the second conductivity type so as to reach the second semiconductor layer of the first conductivity type but not to reach the first semiconductor layer of the first conductivity type.

Thus, when light is incident on the partitioning portion of the photosensitive device, photocarriers generated in a portion which is closer to the surface than a diffusion profile peak ascribable to the first semiconductor layer of the first conductivity type are accelerated by an internal field, thereby enhancing the response speed of the photodiode. Furthermore, the photocarriers generated in the portion which is closer to the surface than the diffusion profile peak ascribable to the first semiconductor layer of the first conductivity type are blocked by a potential barrier, so that the slow-responding photocarriers which are generated in any deeper portion are prevented from contributing to the response of the device. As a result, the response speed of the entire photosensitive device is enhanced.

In one embodiment of the invention, the fourth semiconductor layer of the first conductivity type has an impurity concentration of about $1 \times 10^{14}$ cm$^{-3}$ or more in a portion contacting the first semiconductor layer of the first conductivity type.

In accordance with the aforementioned structure, the serial resistance of the photodiode can be sufficiently reduced, whereby the response speed of the photodiodes can be enhanced.

In another embodiment of the invention, the fourth semiconductor layer of the first conductivity type has an impurity concentration of about $1 \times 10^{18}$ cm$^{-3}$ or less at an interface with the third semiconductor layer of the first conductivity type.

In accordance with the aforementioned structure, autodoping layers are prevented from being formed within the semiconductor device at the time of forming the first semiconductor layer of the second conductivity type. Thus, the response speed of the photodiodes can be prevented from deteriorating.

In still another embodiment of the invention, a plurality of electrode leads having one of opposite polarities of the photosensitive section are provided in a periphery of the plurality of split regions of the photosensitive section.

In accordance with the aforementioned structure, even if the serial resistance of each element is relatively high, a plurality of such elements (having identical resistance) in a parallel arrangement serves to reduce the overall serial resistance, whereby the response speed of the photodiodes can be enhanced.

In still another embodiment of the invention, the first semiconductor layer of the first conductivity type has a higher impurity concentration than an impurity concentration of the semiconductor substrate of the first conductivity type.

In still another embodiment of the invention, the second semiconductor layer of the first conductivity type has a lower impurity concentration than an impurity concentration of the first semiconductor layer of the first conductivity type.

In still another embodiment of the invention, an impurity concentration distribution in the first semiconductor layer of the first conductivity type has a gradient.

In still another embodiment of the invention, the semiconductor device further includes a transistor formed on the semiconductor multilayer structure of the first conductivity type.

In accordance with the aforementioned structure, both a photoelectric conversion portion and a processing portion for processing an electrical signal obtained through photoelectric conversion can be integrated on the same substrate.

According to another aspect of the present invention, there is provided a method for producing a semiconductor device including a photosensitive section, the method including the steps of: forming a first semiconductor layer of a first conductivity type on a semiconductor substrate of the first conductivity type, the first semiconductor layer of the first conductivity type having a higher impurity concentration than an impurity concentration of the semiconductor substrate of the first conductivity type: forming a second semiconductor layer of the first conductivity type on the first semiconductor layer of the first conductivity type, the second semiconductor layer of the first conductivity type having a lower impurity concentration than an impurity concentration of the first semiconductor layer of the first conductivity type; selectively forming an embedded semiconductor layer of a second conductivity type on the second semiconductor layer of the first conductivity type via a first thermal process; selectively forming a fourth semiconductor layer of the first conductivity type via a second thermal process so as to extend through the second semiconductor layer of the first conductivity type and to at least reach the first semiconductor layer of the first conductivity type; forming a first semiconductor layer of the second conductivity type on the second semiconductor layer of the first conductivity type; forming a third semiconductor layer of the first conductivity type so as to extend from the first semiconductor layer of the second conductivity type and to reach the fourth semiconductor layer of the first conductivity type; and forming a fifth semiconductor layer of the first conductivity type so as to extend from the first semiconductor layer of the second conductivity type and to reach the second semiconductor layer of the first conductivity type.

In one embodiment of the invention, the first thermal process and the second thermal process are performed substantially simultaneously.

As a result, the number of production steps, and hence the production cost, can be reduced.

In another embodiment of the invention, the fifth semiconductor layer of the first conductivity type is formed so as not to reach the first semiconductor layer of the first conductivity type.

Thus, the invention described herein makes possible the advantages of (1) providing a photosensitive device with internal circuitry that includes on the same substrate both a photodiode portion and an integrated circuit portion, such that the photodiode portion composes fast-operating split photodiodes whose response speed is not decreased when laser light is incident on the partitioning portion of the split photodiodes; and (2) providing a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 2 is a plan view illustrating split photodiodes according to an example of the present invention.

FIG. 11 is a cross-sectional view illustrating the migration of photocarriers generated when laser light is radiated on a conventional photosensitive device.

DESCRIPTION OF THE PREFERRED EMBODIMENTS

Figure 1:
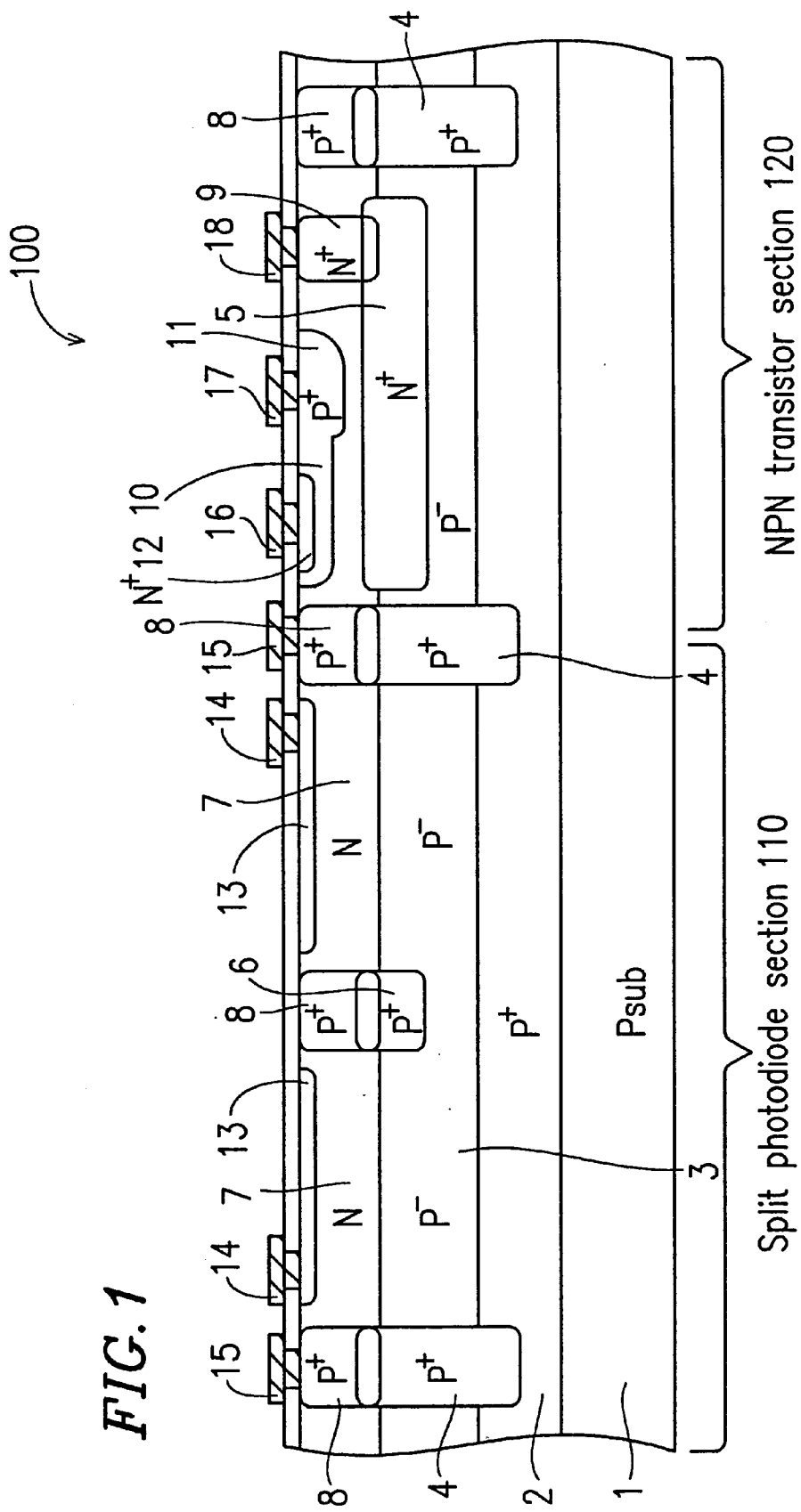
FIG. 1 is a cross-sectional view illustrating a photosensitive device with internal circuitry (integrated circuit) according to an example of the present invention.

FIG. 1 is a cross-sectional view illustrating a photosensitive device 100 with internal circuitry according to an example of the present invention. The photosensitive device 100 with internal circuitry includes a split photodiode section 110 for converting incident light into an electrical signal and an NPN transistor section 120 constituting an integrated circuit portion for processing the electrical signal. The split photodiode section 110 is split into four photosensitive device units. Any covering protection layers and the like are omitted from FIG. 1. FIG. 2 is a plan view illustrating the split photodiode section 110 according to the present example. It should be noted that the split photodiode section 110 appears on a cross section taken at line a–a' in the plan view of FIG. 2.

As shown in FIGS. 1 and 2, the photosensitive device with internal circuitry according to the present example includes a high concentration P-type embedded diffusion layer 2 (having a low resistance, e.g., about 0.01 Ω·cm), an ultra-low concentration P-type epitaxial layer 3 (having a high resistance, e.g., about 1000 Ω·cm), and an N-type epitaxial layer 7 (about 3 Ω·cm),which are laminated in this order on a P-type semiconductor substrate 1 (40 Ω·cm). In the P-type epitaxial layer 3, a P-type separation diffusion layer 4 is provided which extends from the surface of the P-type epitaxial layer 3 into the P-type embedded diffusion layer 2. A P-type embedded diffusion layer 8 is provided in the N-type epitaxial layer 7 so as to overlie the P-type separation diffusion layer 4. The P-type separation diffusion layer 4 is formed via an ion doping process and a subsequent thermal diffusion process. The P-type embedded diffusion layer 8 is formed via an ion doping process and a subsequent thermal diffusion process. The P-type embedded diffusion layer 8 and the underlying P-type separation diffusion layer 4 together compose a device isolation region 4' (better shown in FIG. 2), which defines the perimeter of the split photodiode section 110 as a surrounded, isolated region from other regions.

Within the region defined as the split photodiode section 110, the P-type embedded diffusion layer 8 (formed in the same fashion as in the device isolation region 4') and a P-type embedded diffusion layer 6, which is formed in the portion of the P-type epitaxial layer 3 underlying the P-type embedded diffusion layer 8, together compose a partitioning portion 6' (better shown in FIG. 2) which splits the region surrounded by the device isolation region 4' into four discrete photodiode units PDa, PDb, PDc, and PDd as shown in FIG. 2. The P-type embedded diffusion layer 6 is formed to such a depth that it does not reach the P-type embedded diffusion layer 2. The P-type embedded diffusion layer 8 overlying the P-type embedded diffusion layer 6 is embedded within the N-type epitaxial layer 7. Two more photodiodes PDe and PDf are shown in FIG. 2, which are photodiodes for obtaining tracking servo signals (omitted from FIG. 1).

On the right-hand portion of FIG. 1, the NPN transistor section 120 is shown surrounded by the P-type embedded diffusion layer 8 and the underlying P-type separation diffusion layer 4 (i.e., the device isolation region 4', better shown in FIG. 2). An NPN transistor having the following structure is formed in the NPN transistor section 120: An N-type embedded diffusion layer 5 is formed astride the P-type epitaxial layer 3 and the N-type epitaxial layer 7. In the superficial portion of the N-type epitaxial layer 7, an emitter electrode lead 16 which is electrically coupled to an emitter region 12 (composed of an N-type semiconductor layer), a base electrode lead 17 which is electrically coupled to base regions 10 and 11 (each composed of a P-type semiconductor layer), and a collector electrode lead 18 which is electrically coupled to a collector compensation diffusion layer 9 (composed of an N-type semiconductor layer) are provided.

The split photodiode section 110 is employed as a light detection portion of an optical pickup for CD-ROM drives and the like.

In accordance with the split photodiode section 110 of the present example, the P-type embedded diffusion layer 6 is formed so as to reach into the P-type epitaxial layer 3 but not the P-type embedded diffusion layer 2.

The split photodiode section 110 shown in FIG. 2 will now be described. The four split photodiodes PDa, PDb, PDc, and PDd cooperate to read an FES in accordance with the aforementioned astigmatic method or the like. Laser light is radiated on the photodiodes PDa, PDb, PDc, and PDd in a central portion of the split photodiode section 110 where different legs of the partitioning portion 6' intersect. Since the P-type embedded diffusion layer 6, which is formed so as to split the photodiode section 110 into discrete photodiode units, is formed so as to reach into the P-type epitaxial layer 3 but not the P-type embedded diffusion layer 2 (see FIG. 1), the portion underlying the P-type embedded diffusion layer 6, upon which laser light is radiated, is left with an ultra-low concentration, and therefore is depleted in actual operation. Thus, photocarriers which are generated in this depletion region reach the PN junction through rapid migration due to a field drift within the depletion layer. As a result, the response speed of the split photodiode section 110 is enhanced according to the present example of the invention.

The junction capacitance of the split photodiode section 110 according to the present example refers to the capacitance associated with the PN junction between the ultra-low concentration P-type epitaxial layer 3 (having a high resistance, e.g., about 1000 Ω·cm) and the N-type epitaxial layer 7 (about 3 Ω·cm). The P-type epitaxial layer 3 has a small parasitic capacitance because it is formed on the high concentration P-type embedded diffusion layer 2 (having a low resistance, e.g., about 0.01 Ω·cm), which in turn is provided on the P-type semiconductor substrate 1 (40 Ω·cm).

Since the split photodiode section 110 is isolated from the surroundings by the low resistance P-type embedded diffusion layer 2 and the P-type separation diffusion layer 4, the split photodiode section 110 also has a low serial resistance.

In the NPN transistor 120, which is formed on the same substrate that the split photodiode section 110 is formed on, the ultra-low concentration P-type epitaxial layer 3 exists under the N-type embedded diffusion layer 5, thereby reducing the collector-substrate capacitance. As a result, the NPN transistor 120 (which is a bipolar transistor) also has an enhanced response speed.

The problem of latch-up of a parasitic thyristor is substantially prevented in the photosensitive device 100 with internal circuitry because the high concentration P-type embedded diffusion layer 2 is formed between the P-type semiconductor substrate 1 and the ultra-low concentration and high resistance P-type epitaxial layer 3 and because the high concentration P-type embedded diffusion layer 2 is coupled to the low resistance P-type separation diffusion layer 4, which is part of the device isolation region 4'.

If the high concentration separation diffusion layer 4 is not formed, the resultant photosensitive device may become less immune to the problem of a parasitic thyristor latch-up.

By reducing the serial resistance formed by the P-type separation diffusion layer 4 and the P-type embedded diffusion layer 2 in the aforementioned manner, the frequency characteristics of the split photodiode section 110 can be improved while substantially preventing the problem of a parasitic thyristor latch-up in the transistor. However, with respect to any two adjoining diffusion layers, the impurity concentration in the interface of each diffusion layer plays an important role, as described below.

For example, consider split photodiodes for use in an optical pickup of a 10× speed read DVD-ROM drive. Such split photodiodes require a cut-off frequency of at least about 75 MHz during operation. Now, split photodiodes for use in an optical pickup of a 10× speed read DVD-ROM drive may be constructed in a 60×200 $\mu m^2$ size, for example. When constructed in such a size, the split photodiode section 110 according to the present invention will have a junction capacitance of about 0.5 pF. The junction capacitance, serial resistance, and cut-off frequency of the split photodiode section 110 satisfy the relationship:

cut-off frequency=1/{2π(junction capacitance of photodiodes)× (serial resistance of photodiodes)}.

By resolving the above equation, it is calculated that a serial resistance of about 4 kΩ or less is required in order to obtain a cut-off frequency of 75 MHz or more. When other factors such as the cathode-side resistance are also considered, the serial resistance, which is determined by the P-type separation diffusion layer 4 and the P-type embedded diffusion layer 2, should be about 1.5 kΩ or less.

Figure 3A:
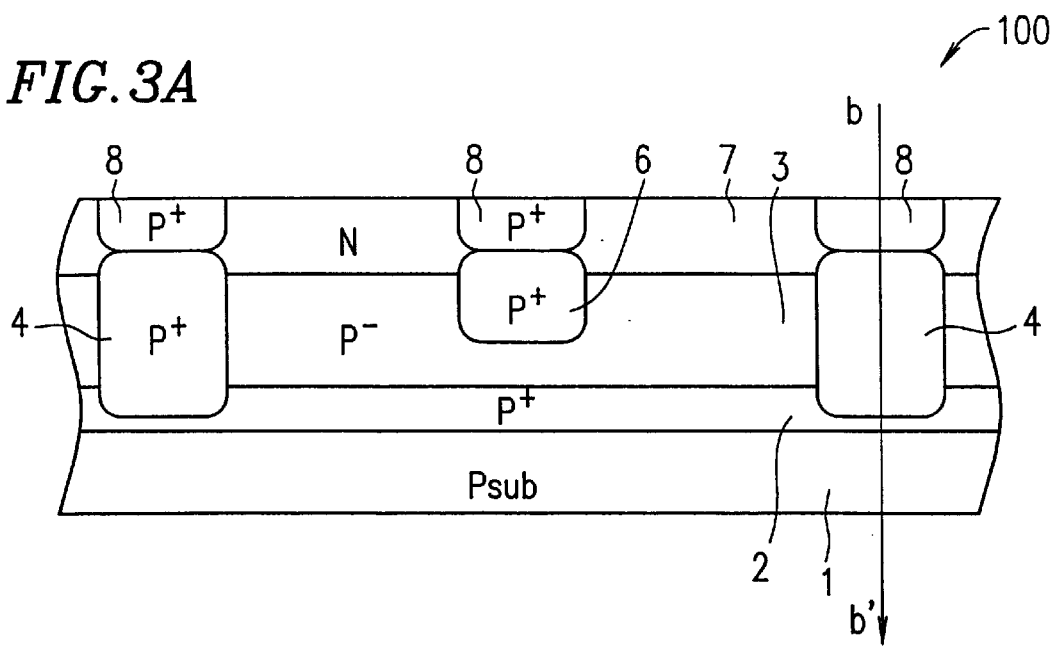
FIG. 3A is a cross-sectional view illustrating split photodiodes according to an example of the present invention.
Figure 3B:
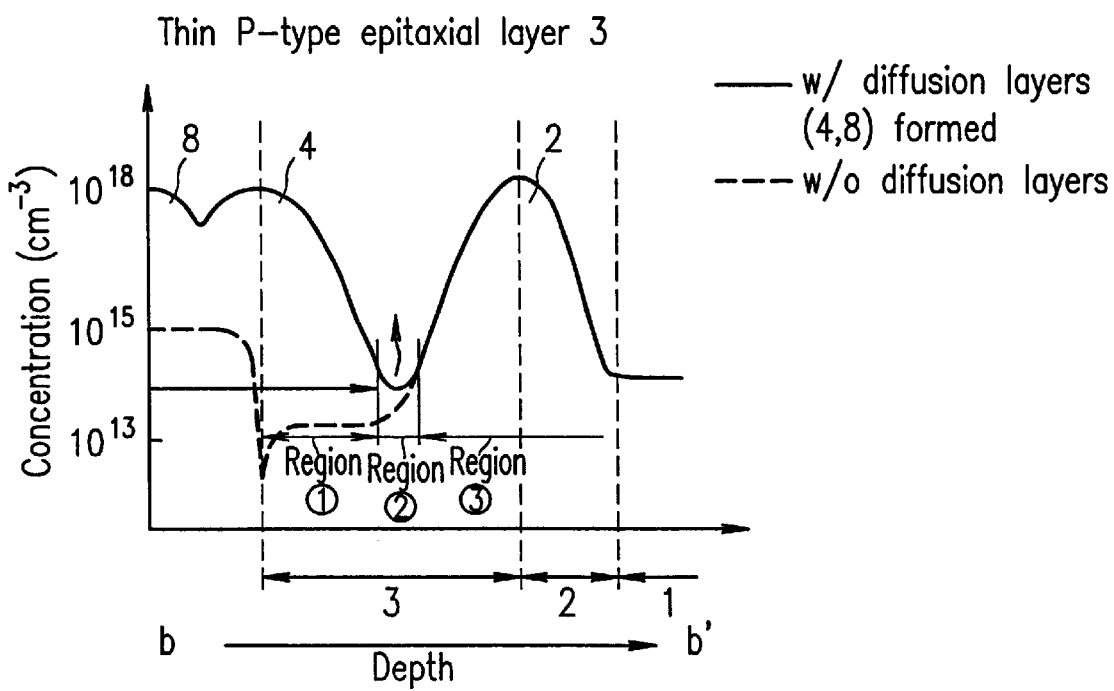
FIG. 3B is a graph illustrating a diffusion profile in a diffusion layer along line b–b' in FIG. 3A in the case where a relatively thin P-type epitaxial layer Is employed.
Figure 3C:
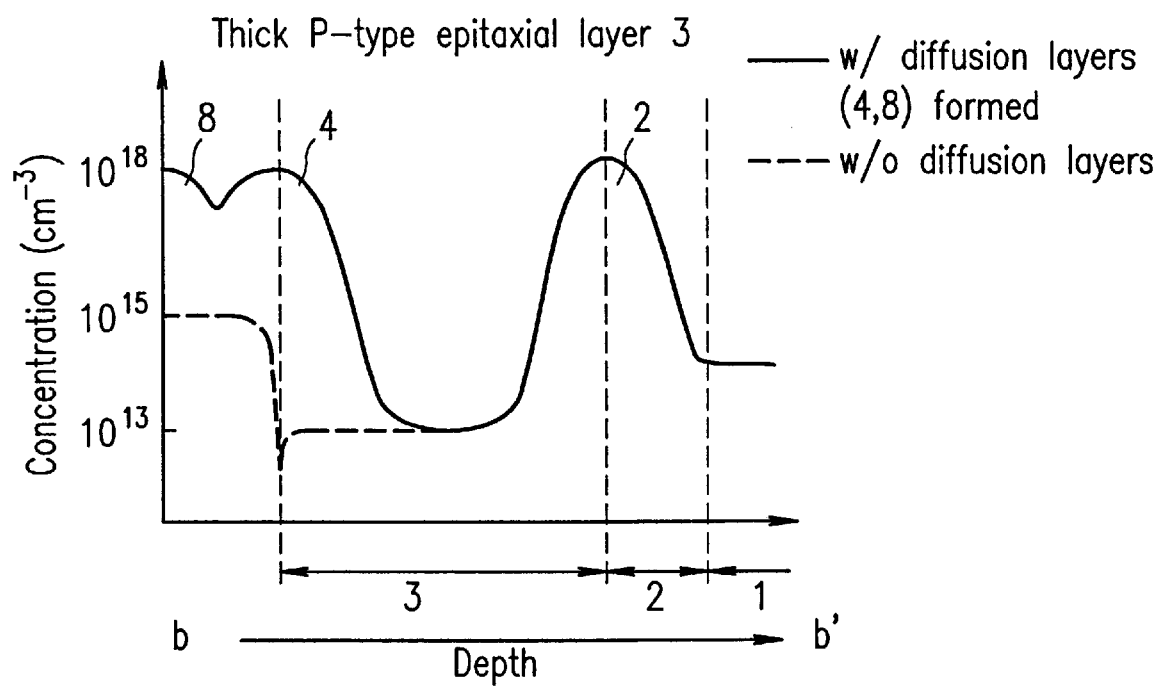
FIG. 3C is a graph illustrating a diffusion profile in a diffusion layer along line b–b' in FIG. 3A in the case where a relatively thick P-type epitaxial layer is employed.

FIG. 3A is a schematic diagram illustrating an essential portion of the photosensitive device 100 with internal circuitry according to the present example of the invention. FIG. 3B is a graph illustrating a diffusion profile in the device isolation region 4' along line b–b' in FIG. 3A, where a relatively thin P-type epitaxial layer 3 is employed. FIG. 3C is a graph illustrating a diffusion profile in the device isolation region 4' along line b–b' in FIG. 3A, where a relatively thick P-type epitaxial layer 3 is employed. As shown in FIGS. 3B and 3C, the P-type separation diffusion layer 4 and the P-type embedded diffusion layer 2 each have a characteristic peak in the diffusion profile such that the resistance ratio between region ①: region ②: region ③=about 1: about 100: about 1. Therefore, the value of the resultant serial resistance is substantially determined by the resistance in region ②.

Next, the resistance in region ② is calculated. The resistance in region ② varies depending on the actual configuration of the P-type separation diffusion layer 4. Assuming that region ② is 2×200 $\mu m^2$ (which corresponds to the term named "area" in the equation below), for example, and that region ② has a depth of about 1 $\mu m$ (which provides the term named "length" in the equation below), the following equation is used for our calculation:

(resistance in region ②)=(resistivity)×(length)/(area).

When resolved with respect to (resistivity), the above equation gives:

(resistivity)=(resistance in region ②)×(area)/(length).

So, by substituting the above-exemplified values in this equation, the resistivity is calculated to be 1500 (Ω)×2×200 ($\mu m^2$)/1 ($\mu m$)=60 (Ω·cm).

Thus, it is necessary to ensure that the resistivity in region ② is about 60(Ω·cm) or less. The impurity concentration under the condition that resistivity=about 60(Ω·cm) is calculated to be about $2 \times 10^{14}$ $cm^{-3}$, which corresponds to the average concentration in region ②. Thus, it is necessary to ensure that the lowest point in the diffusion profile (indicated by an arrow in FIG. 3B) is about $1 \times 10^{14}$ $cm^{-3}$.

On the other hand, in the case where a relatively thick P-type epitaxial layer 3 is employed, as shown in FIG. 3C, performing a thermal process for forming the P-type separation diffusion layer 4 cannot successfully produce a diffusion layer which is large enough to have a region that extends through the P-type epitaxial layer 3 to reach the P-type embedded diffusion layer 2. In other words, a region in which no diffusion layer is formed (as evidenced by the flat bottom in FIG. 3C) exists between the characteristic peak ascribable to the P-type embedded diffusion layer 2 and the characteristic peak ascribable to the P-type separation diffusion layer 4 in the diffusion profile. Therefore, the resultant serial resistance is increased so that the response speed of the split photodiode section 110 is lowered. Thus, it can be seen that it is also essential to select an appropriate thickness for the P-type epitaxial layer 3.

In order to form the P-type separation diffusion layer 4 as described above, the thickness of the P-type epitaxial layer 3 (which will be discussed later in more detail) and the diffusion profile ascribable to the P-type embedded diffusion layer 2 are important. In the structure according to the present example, the P-type embedded diffusion layer 2 is formed in order to reduce the serial resistance, although the P-type embedded diffusion layer 2 serves two functions as described below.

Figure 4A:
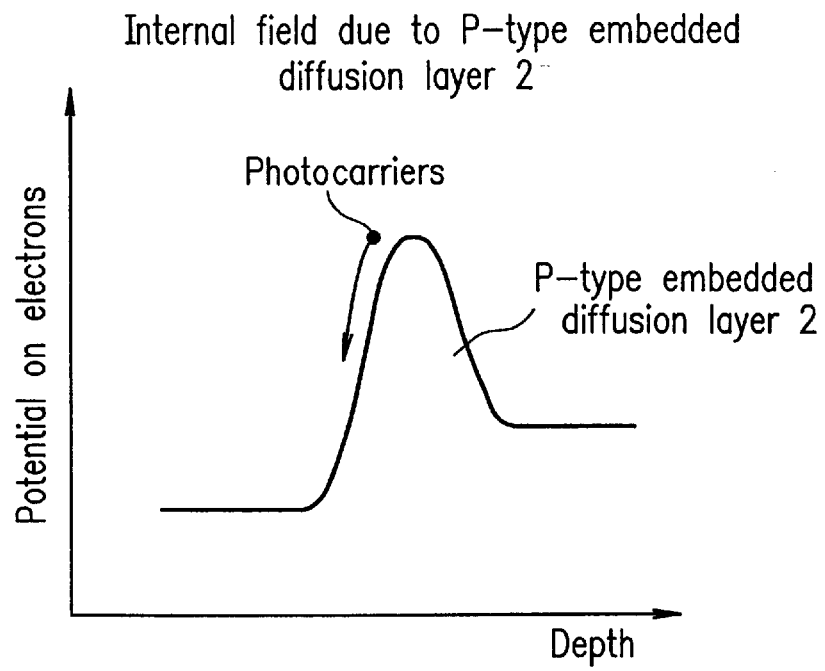
FIG. 4A is a graph illustrating improvement in the response speed of a photosensitive device according to the present invention due to the action of an internal field across a diffusion layer.

Firstly, the characteristic peak in the diffusion profile ascribable to the P-type embedded diffusion layer 2 (as shown in FIG. 4A) is utilized in such a manner that the photocarriers generated in a portion which is closer to the surface than the said peak ascribable to the P-type embedded diffusion layer 2 are accelerated by an internal field which is created due to an impurity concentration gradient. The internal field becomes more intense, and therefore more apt to accelerate the photocarriers, as the characteristic peak in the diffusion profile ascribable to the P-type embedded diffusion layer 2 becomes steeper.

Figure 4B:
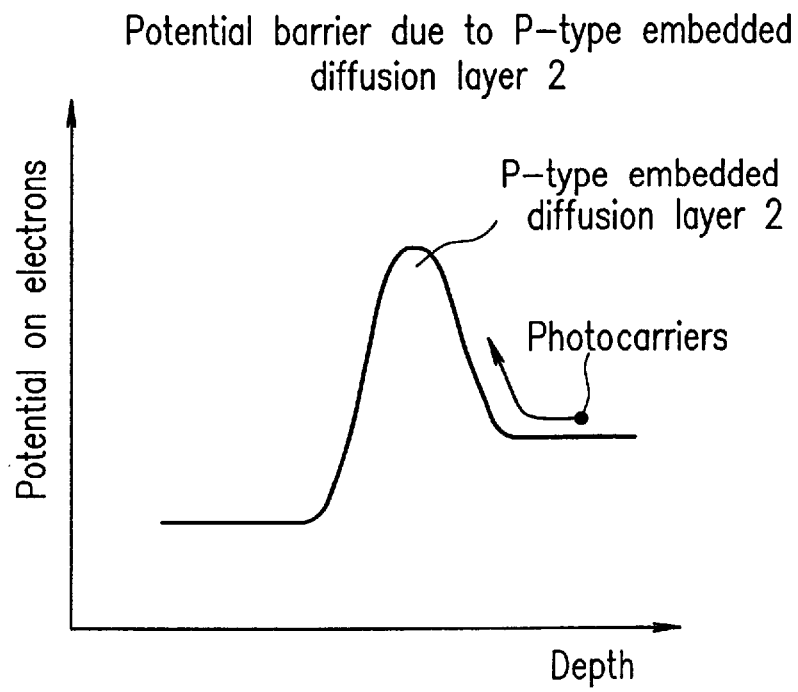
FIG. 4B is a graph illustrating the operation of a photosensitive device according to the present invention due to the action of a potential barrier in a diffusion layer.

Secondly, the characteristic peak in the diffusion profile ascribable to the P-type embedded diffusion layer 2 is utilized (as shown in FIG. 4B) as a potential barrier for blocking the photocarriers generated in a portion which is closer to the surface than the said peak ascribable to the P-type embedded diffusion layer 2. In the case where the optical pickup employs laser light having a commonly employed wavelength λ=780 nm, more than a negligible amount of photocarriers are generated at deep portions in the substrate (for example, the photocarriers which are generated at a depth of about 15 $\mu m$ from the surface account for about 16% of the entire photocarriers). The photocarriers which are generated at deep portions in the substrate show a slow response because they have to migrate over to the depletion region via diffusion; this represents a difficulty in enhancing the response speed of the entire photosensitive device. Therefore, in order to improve the response speed, it is effective to block the photocarriers which are generated at portions deeper than a certain level, with a potential barrier which is provided by the P-type embedded diffusion layer 2, so that these photocarriers are allowed to recombine and therefore do not contribute to the response characteristics (although this may result in some decrease in the sensitivity of the photosensitive device circuitry). This effect also becomes more outstanding as the characteristic peak in the diffusion profile ascribable to the P-type embedded diffusion layer 2 becomes steeper because the photocarriers which are generated at portions closer to the substrate will have more difficulties trying to override the P-type embedded diffusion layer 2 and hence be obliged to recombine.

For the aforementioned two reasons, it is preferable that the diffusion profile of the P-type embedded diffusion layer 2 be steep. However, it must also be noted that each diffusion layer is formed through a carrier implantation process and a thermal carrier diffusion process.

For example, as the diffusion is achieved by performing a thermal process for a longer period time or at a higher temperature in order to ensure that the P-type separation diffusion layer 4 contacts the low resistance embedded diffusion layer 2, the P-type embedded diffusion layer 2 will have a larger expanse toward the surface and toward the substrate. A larger expanse of the P-type embedded diffusion layer 2 implies the P-type embedded diffusion layer 2 having a more spread-out and lower-concentration diffusion profile, i.e., a lower potential barrier. Consequently, the aforementioned two effects that will be provided by a steep potential barrier are partially lost, so that there is less improvement in the response characteristics of the split photodiode section 110. For this reason, the thermal processes must be kept minimum. Another possible cause for a slower response is the fact that the expanse of the depletion layer from the PN junction is limited by the P-type embedded diffusion layer 2 that is present on the substrate, which increases the junction capacitance.

Therefore, by unifying the thermal process for forming the transistor portion and the like together with the thermal process for forming the P-type separation diffusion layer 4, the number of thermal processes to be performed can be minimized, while also reducing the number of production steps and the production cost, and simplifying the process.

In any given thermal process, if an excessively high carrier concentration is employed in order to form a deeper P-type separation diffusion layer 4, boron (B) autodoping may occur in a subsequent process for growing the N-type epitaxial layer 7. Specifically, autodoping occurs as boron atoms, which may be present in the background of a bell jar in which epitaxial growth processes take place, or may have emerged into the chamber space from within a wafer, are again adsorbed into the wafer. The occurrence of autodoping could present a fatal hindrance in forming a high-speed split photodiode section 110, as will be described with reference to FIGS. 5A to 5C below.

Figure 5A:
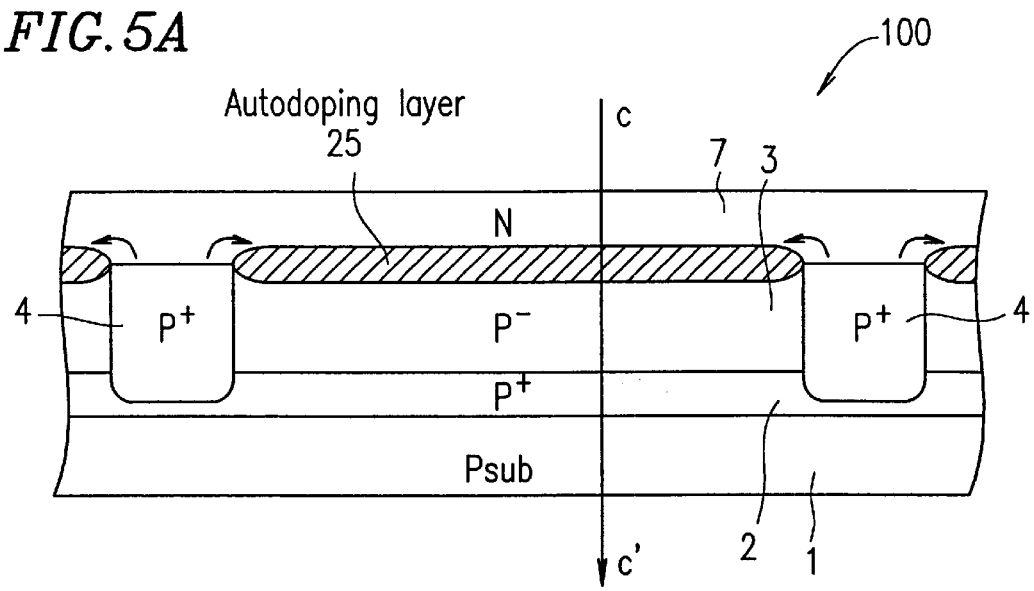
FIG. 5A is a cross-sectional view illustrating the formation of an autodoping layer.
Figure 5B:
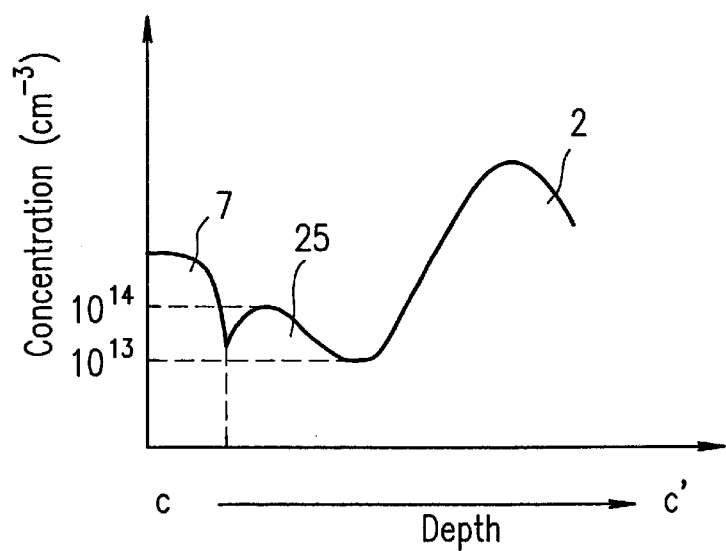
FIG. 5B is a graph illustrating a diffusion profile the photosensitive device shown in FIG. 5A along line c–c'.
Figure 5C:
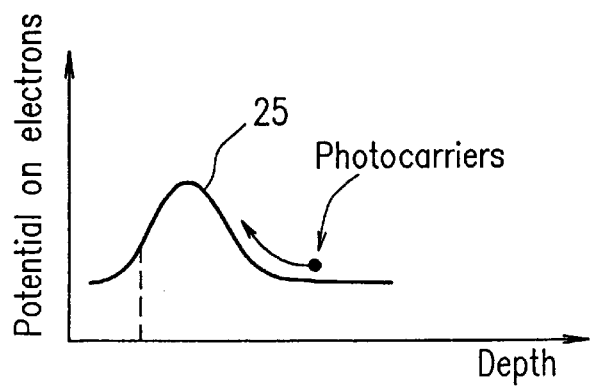
FIG. 5C is a graph illustrating a diffusion profile in an autodoping layer of the photosensitive device shown in FIG. 5A along line c–c'.

As shown in FIG. 5A, if boron autodoping occurs when growing the N-type epitaxial layer 7, a P-type autodoping layer 25 is formed near the interface between the N-type epitaxial layer 7 and the P-type epitaxial layer 3. These layers may have a diffusion profile as shown in FIG. 5B. Since the P-type epitaxial layer 3 is designed to have a low concentration in order to reduce the junction capacitance according to the present example, the P-type autodoping layer 25 has a higher impurity concentration than that of the P-type epitaxial layer 3. Since the expanse of the depletion layer from the N-type epitaxial layer 7 toward the P-type epitaxial layer 3 is limited by such a P-type autodoping layer 25, the junction capacitance between the N-type epitaxial layer 7 and the P-type epitaxial layer 3 cannot be adequately reduced. Moreover, as shown in FIG. 5C, the P-type autodoping layer 25 behaves as a potential barrier against the photocarriers which are generated in the P-type epitaxial layer 3, whereby the photocarrier migration is hindered so that the response of the split photodiode section 110 becomes slow.

According to the present example, the impurity concentration in the P-type separation diffusion layer 4 is prescribed at a certain level or lower such that the autodoping layer 25 will not limit the expanse of the depletion layer. For example, in order to prevent an increase in the junction capacitance in the split photodiode section 110 when an inverse voltage of 1.5 V is applied, it is necessary to ensure that the autodoping layer 25 has a peak concentration of about $1 \times 10^{14}$ cm$^{-3}$ or less. So long as the surface concentration in the P-type separation diffusion layer 4 is maintained at about $1 \times 10^{18}$ cm$^{-3}$ or less, the autodoping effects due to the boron atoms within the wafer become negligible because the area of the P-type separation diffusion layer 4 containing boron accounts for about 10% or less of the entire wafer and because only a small portion of the boron atoms within the wafer will actually emerge into the chamber space, much less be adsorbed back into the wafer.

The conditions of the thermal process for forming the P-type separation diffusion layer 4, and the upper limit of the impurity concentration in the P-type separation diffusion layer 4 for attaining improved response characteristics of the split photodiode section 110 can be determined based on the above discussion. Then, after the diffusion profile of the P-type separation diffusion layer 4 which is formed under such thermal process conditions and impurity concentration constraints is obtained, the thickness of the P-type epitaxial layer 3 may be appropriately selected so that the P-type separation diffusion layer 4 extends through the P-type epitaxial layer 3 and contacts the P-type embedded diffusion layer 2 with a sufficient concentration (e.g., about $1 \times 10^{14}$ cm$^{-3}$).

Figure 6A:
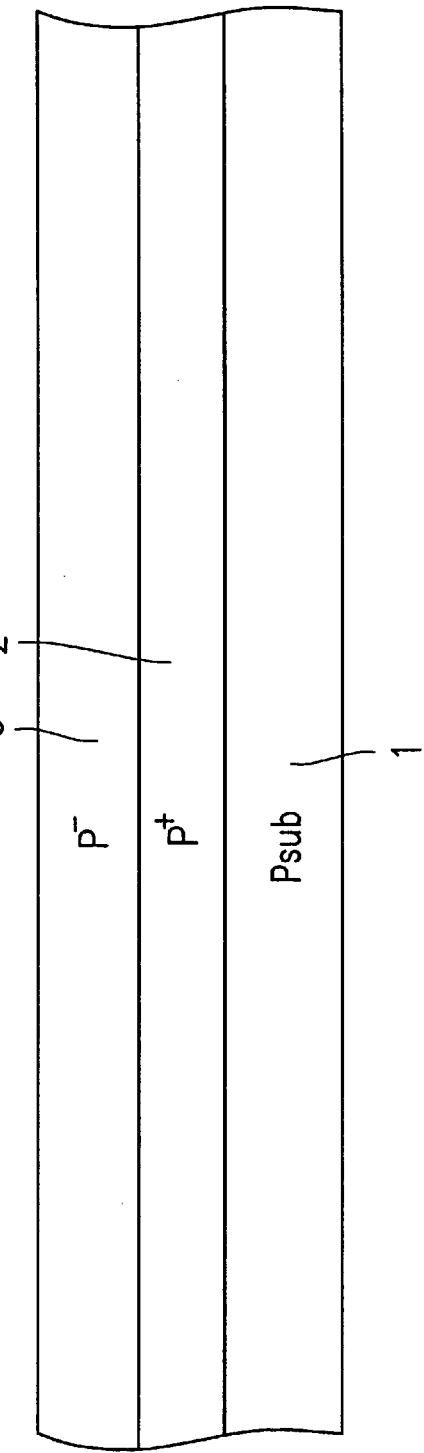
FIG. 6A is a diagram illustrating a step of a method for producing a photosensitive device with internal circuitry according to an example of the present invention.
Figure 6B:
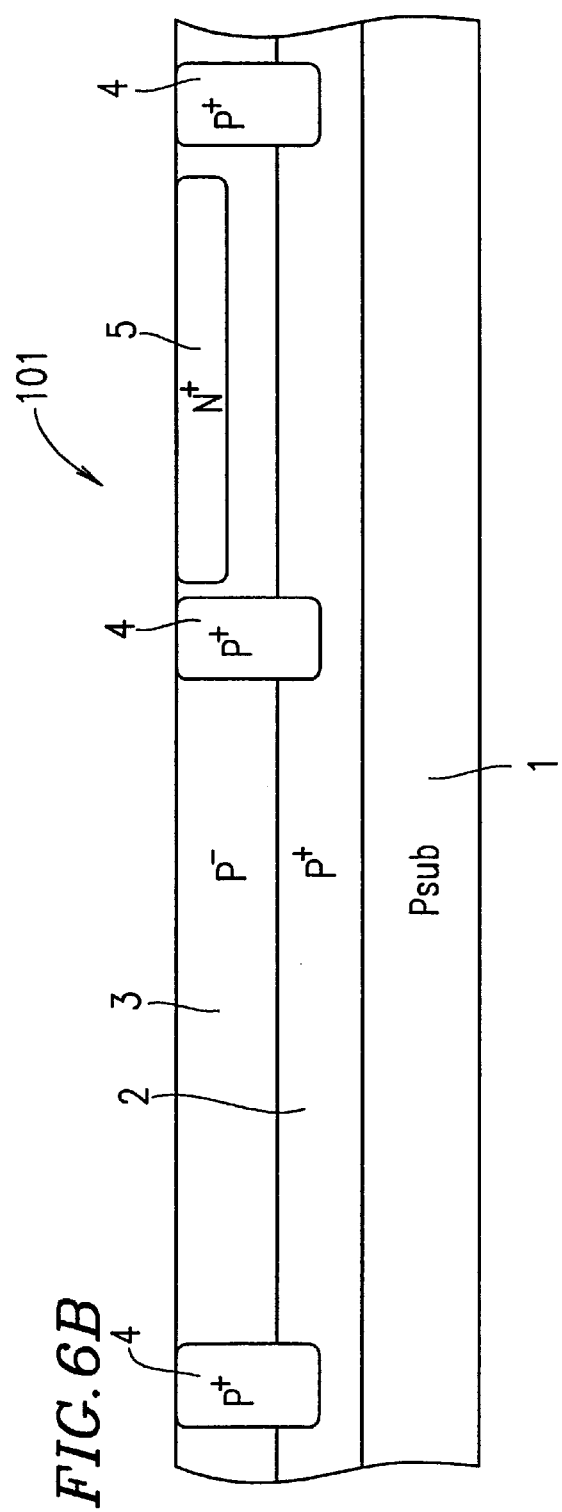
FIG. 6B is a diagram illustrating a step of a method for producing a photosensitive device with internal circuitry according to an example of the present invention.

Next, a method for producing the photosensitive device with internal circuitry having the structure shown in FIG. 1 according to the present example of the invention, where the problems associated with serial resistance and autodoping effects are duly addressed, will be described with reference to FIGS. 6A to 6C.

Boron is applied at a high concentration on a P-type semiconductor substrate 1 (resistivity: about 30 to about 50 Ω·cm) which is prepared by a CZ method, and subjected to a thermal process to form a high concentration P-type embedded diffusion layer 2 with a peak concentration of about $1 \times 10^{18}$ cm$^{-3}$. On the high concentration P-type embedded diffusion layer 2, a high resistance (low concentration) P-type epitaxial layer 3 having a resistivity of about 10 to about 1000 Ω·cm is formed. Thus, a P-type semiconductor multilayer structure 101 as shown in FIG. 6A is obtained.

Next, about $3 \times 10^{14}$ ions/cm$^2$ of boron is ion-implanted at about 65 keV in a device isolation region and at least a region which is required to prevent a parasitic thyristor latch-up in the integrated circuit portion. Thereafter, Sb (antimony) is applied on an embedded collector region of the NPN transistor, and subjected to a thermal process at about 1200° C. This thermal process also serves as a thermal process for forming a N-type embedded diffusion layer 5 and a thermal formation process for forming a P-type separation diffusion layer 4 from the previously implanted boron. The thickness of the P-type epitaxial layer 3 is prescribed to be a value such that the P-type separation diffusion layer 4 reaches the P-type embedded diffusion layer 2 (FIG. 6B). In accordance with this structure, by ensuring that the P-type embedded diffusion layer 2 has a steep diffusion profile, the serial resistance of the split photodiode section 110, which is determined by the P-type separation diffusion layer 4 and the P-type embedded diffusion layer 2, can be reduced and the response speed enhanced. Furthermore, the number of processes to be performed and the duration of high-temperature thermal processes can be reduced, and the process can be simplified.

Next, about $1.8 \times 10^{14}$ ions/cm$^2$ of boron is ion-implanted at about 65 keV in a partitioning portion 6' and the device isolation region 4' (see FIG. 2), and thereafter an N-type epitaxial layer 7 is grown so as to have a resistivity of about 3.0 Ω·cm and a thickness of about 3.0 µm. Then, a thermal process is performed so as to form a P-type embedded diffusion layer 6. These thermal processes are performed at a lower temperature and for a shorter duration than in the thermal processes for forming the P-type separation diffusion layer 4 and the N-type embedded diffusion layer 5.

Figure 6C:
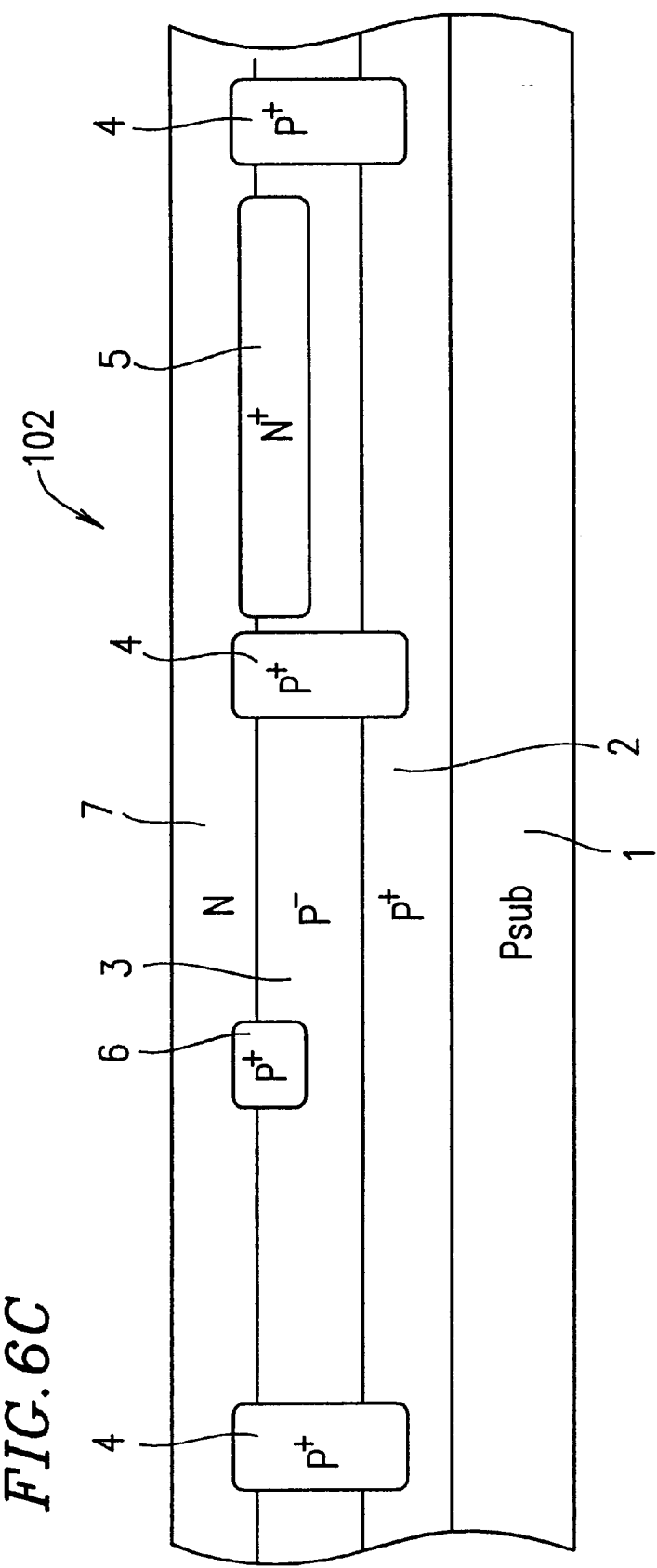
FIG. 6C is a diagram illustrating a step of a method for producing a photosensitive device with internal circuitry according to an example of the present invention.

Therefore, the P-type embedded diffusion layer 6 only expands to a depth which is shallower than the depth of the P-type separation diffusion layer 4 (see FIG. 6C). In accordance with the PN junction structure 102 shown in FIG. 6C, the P-type epitaxial layer 3 is formed so as to have a thickness such that the P-type embedded diffusion layer 6 does not penetrate all the way through the P-type epitaxial layer 3 while the P-type separation diffusion layer 4 does penetrate all the way through the P-type epitaxial layer 3. According to the present example of the invention, the thickness of the P-type epitaxial layer 3 is prescribed at about 15 μm.

Next, boron ions are implanted from the surface of the N-type epitaxial layer 7. Then, as shown in FIG. 1, annealing is performed to form a P-type embedded diffusion layer 8. After various regions of a transistor (i.e., an NPN transistor collector compensation diffusion layer 9, an internal base diffusion layer 10, an external base diffusion layer 11, and an emitter diffusion layer 12) are formed, an N-type diffusion layer 13, which doubles as a VPNP base diffusion layer (not shown), is formed for reducing the cathode resistance of the split photodiode section 110. Finally, various contacts, metal (AlSi) wiring, and a covering protection layer (not shown) are formed.

The photosensitive device 100 with internal circuitry shown in FIG. 1 is accomplished by the aforementioned method.

Figure 7:
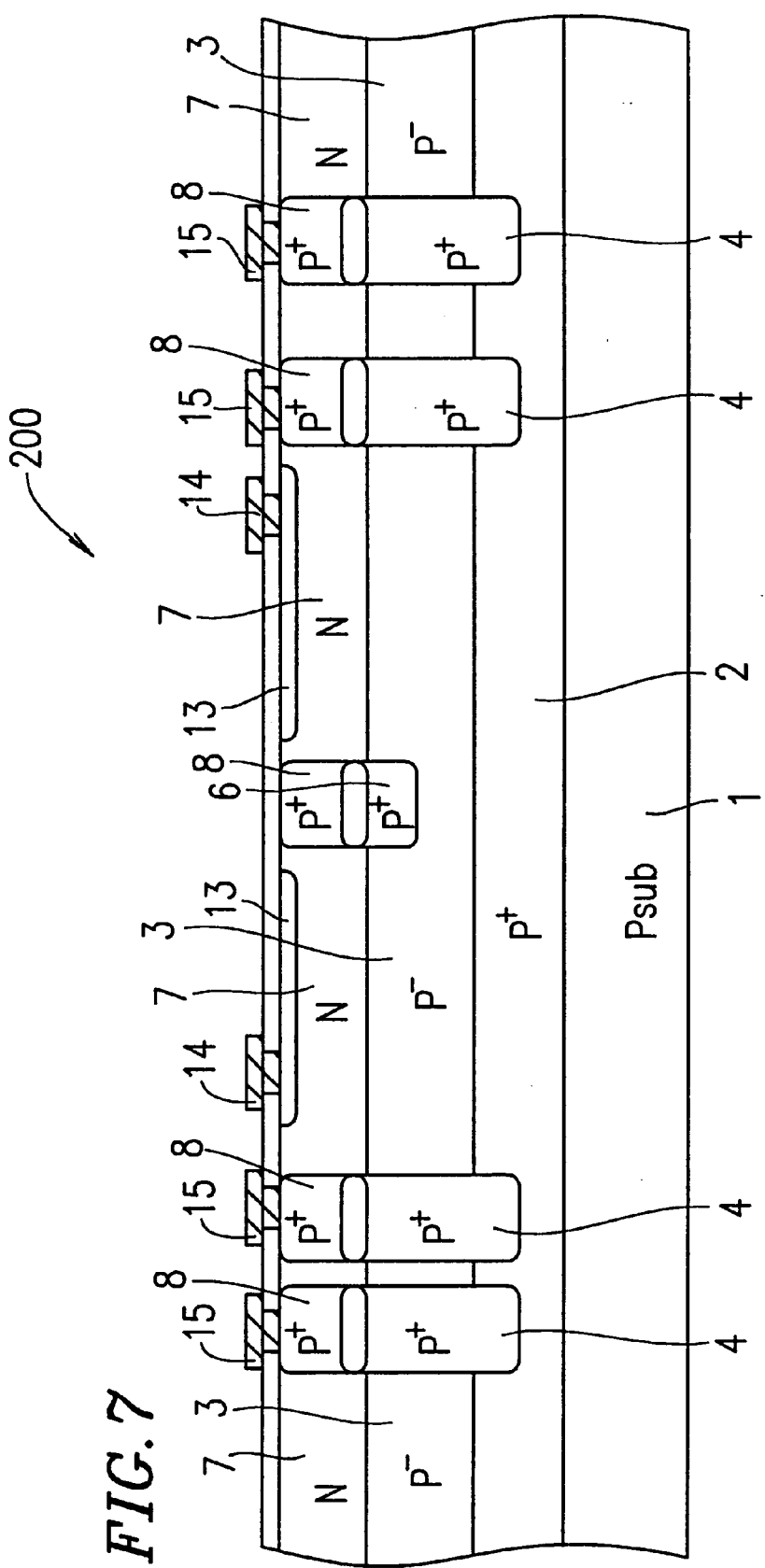
FIG. 7 is a cross-sectional view illustrating split photodiodes according to an example of the present invention.
Figure 8:
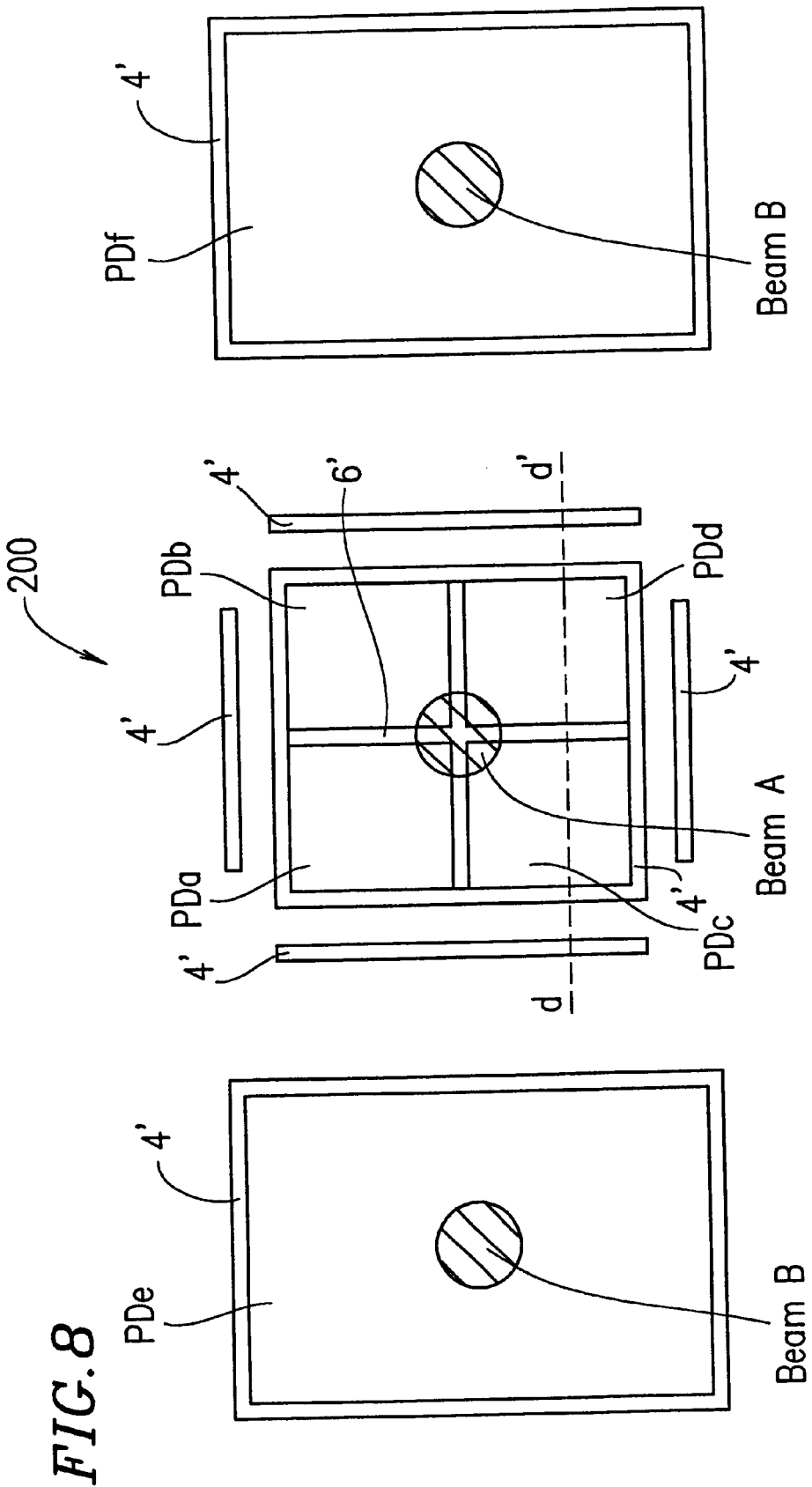
FIG. 8 is a plan view illustrating split photodiodes according to an example of the present invention.
Figure 9:
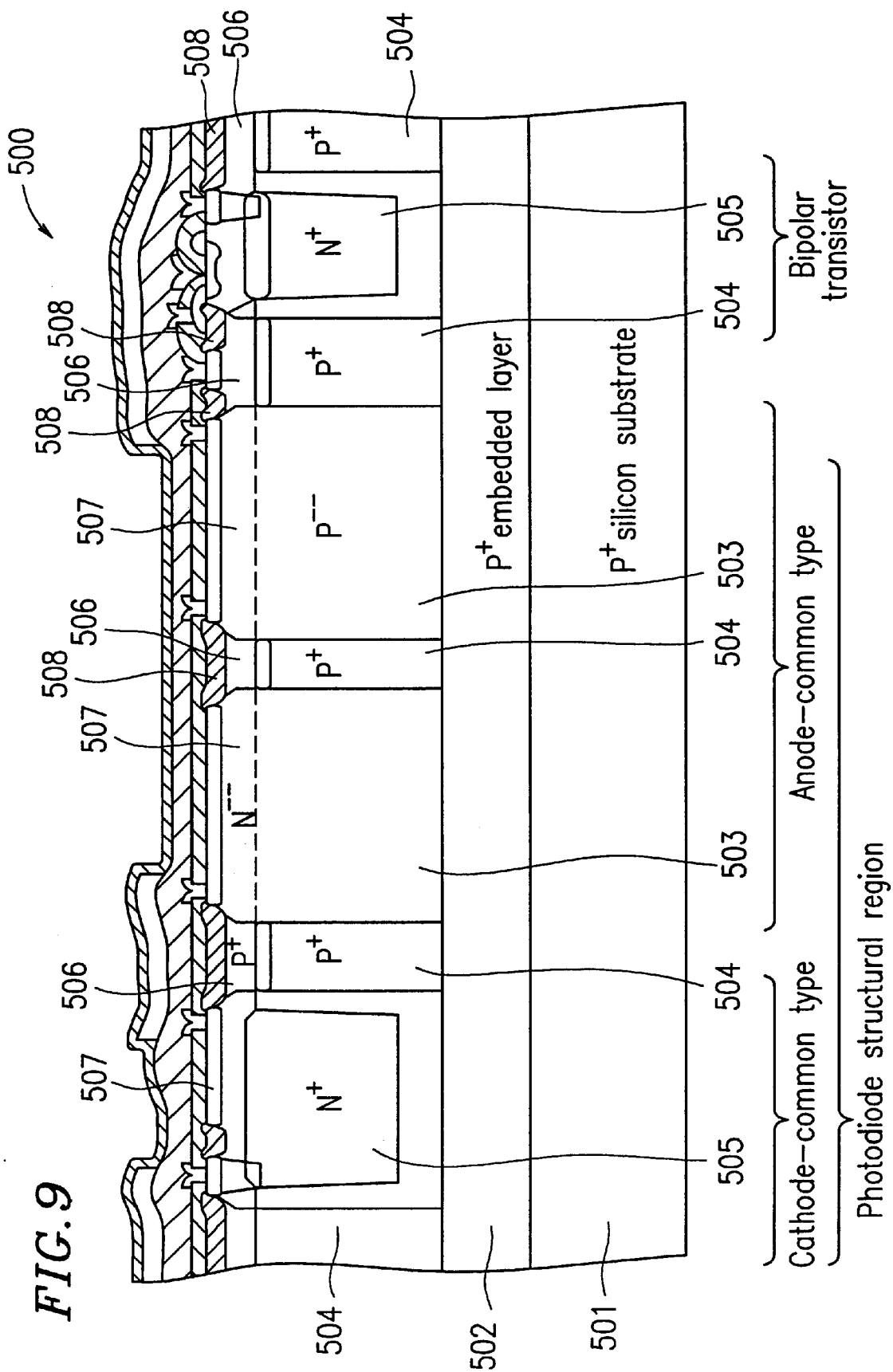
FIG. 9 is a cross-sectional view illustrating a conventional photosensitive device with internal circuitry.
Figure 10A:
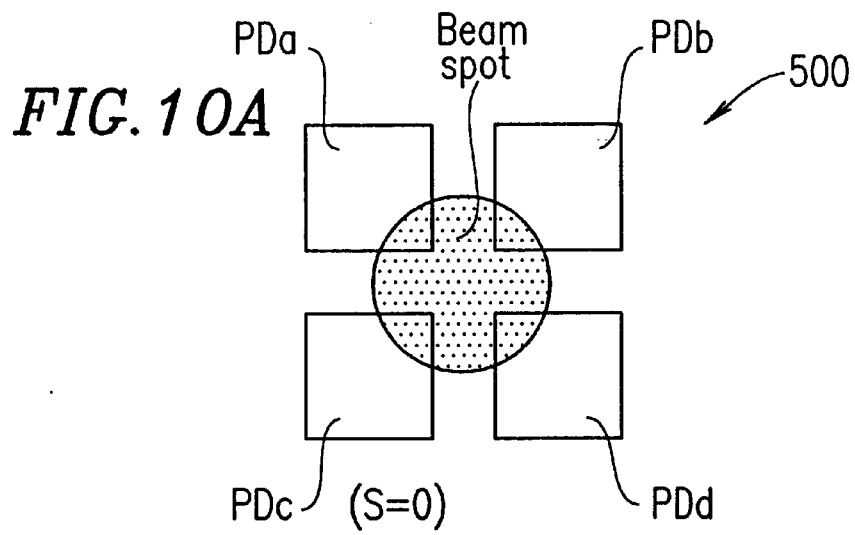
FIG. 10A is a diagram illustrating the relative positions of a beam spot and split photodiodes in accordance with an astigmatic method.
Figure 10B:
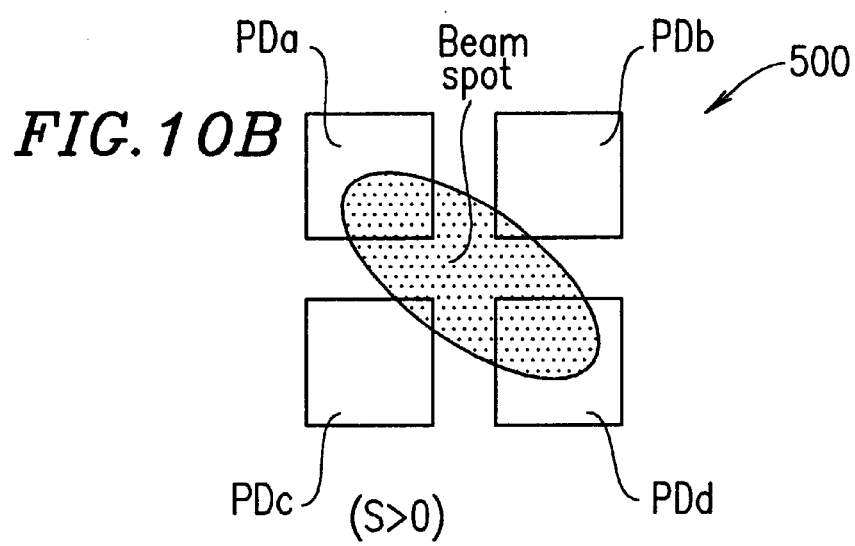
FIG. 10B is a diagram illustrating the relative positions of a beam spot and split photodiodes in accordance with an astigmatic method.
Figure 10C:
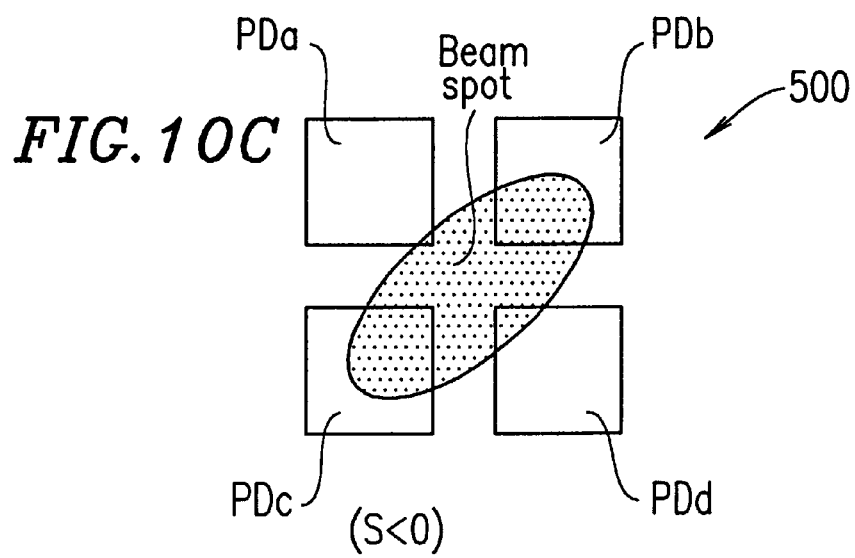
FIG. 10C is a diagram illustrating the relative positions of a beam spot and split photodiodes in accordance with an astigmatic method.

Furthermore, in order to reduce the serial resistance without increasing the junction capacitance, it is effective to form a plurality of anode electrode leads 15, as shown in FIG. 7. In the photosensitive device 200 with internal circuitry shown in FIG. 7, the anode electrode leads 15 are formed on the device isolation region 4' (including the P-type embedded diffusion layer 8 and the P-type separation diffusion layer 4, which is formed so as to reach the high concentration P-type embedded diffusion layer 2). As a result, even in the case where the portions of the P-type separation diffusion layer 4 and the P-type embedded diffusion layer 2 which contact each other do not have a sufficiently high concentration, so that each device isolation region 4' may have a high serial resistance, the overall serial resistance can still be reduced due to the presence of a plurality of device isolation regions 4' (the P-type embedded diffusion layer 8 and the P-type separation diffusion layer 4) in a parallel arrangement which have the same resistance value. A plan view of such a plurality of device isolation regions 4' in a parallel arrangement is shown in FIG. 8, where extra device isolation regions 4' are illustrated as extending in parallel to the device isolation regions 4' which enclose the rectangular split photodiode section 110. More specifically, the linear-shaped extra device isolation region 4' extend so as to partially surround the device isolation regions 4' which enclose the rectangular split photodiode section 110 in the illustrated example. It is preferable that the anode electrode leads be appropriately coupled via a conductive material such as AlSi.

In accordance with the split photodiodes according to the present invention, the diffusion structure composing a partitioning portion, on which light will be incident, and the diffusion structure composing a device isolation region, on which no light will be incident, are separately formed, so that the partitioning portion does not have its response speed decreased due to irradiation by light. Thus, high-speed split photodiodes can be obtained which has reduced parasitic resistance and parasitic capacitance. Moreover, since the parasitic capacitance of a transistor which is formed on the same substrate is reduced for a faster operation speed, and the same diffusion structure as that of anode electrode leads (which may be provided for reducing the parasitic resistance of the photodiodes) is provided at least for the sake of isolation between the transistor and the photodiodes, it is possible to prevent a parasitic thyristor latch-up. By providing a plurality of low-resistance anode electrode leads around the split photodiodes, the parasitic resistance of the photodiodes can be further reduced for a further enhanced response speed. Since the thermal processes required in the present invention also serve the purposes of conventional thermal processes of forming transistors, the production cost is prevented from increasing.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a semiconductor multilayer structure of a first conductivity type;
   a first semiconductor layer of a second conductivity type, formed on the semiconductor multilayer structure of the first conductivity type;
   a photosensitive section comprising a PN junction between the semiconductor multilayer structure of the first conductivity type and the first semiconductor layer of the second conductivity type; and
   a partitioning portion for splitting the photosensitive section into a plurality of regions,
   wherein the semiconductor multilayer structure of the first conductivity type comprises:
      a semiconductor substrate of the first conductivity type;
      a first semiconductor layer of the first conductivity type formed on the semiconductor substrate of the first conductivity type; and
      a second semiconductor layer of the first conductivity type formed on the first semiconductor layer of the first conductivity type,
   wherein the photosensitive section is formed in a region surrounded by a third semiconductor layer of the first conductivity type, the third semiconductor layer of the first conductivity type extending from a surface of the first semiconductor layer of the second conductivity type so as to reach the second semiconductor layer of the first conductivity type, and
   a fourth semiconductor layer of the first conductivity type is provided under the third semiconductor layer of the first conductivity type, wherein the fourth semiconductor layer of the first conductivity type overlaps with at least a portion of the third semiconductor layer of the first conductivity type, extends through the second semiconductor layer of the first conductivity type, and at least reaches the first semiconductor layer of the first conductivity type, and
   wherein the partitioning portion comprises a fifth semiconductor layer of the first conductivity type extending from the first semiconductor layer of the second conductivity type so as to reach the second semiconductor layer of the first conductivity type but not to reach the first semiconductor layer of the first conductivity type.

2. A semiconductor device according to claim 1, wherein the fourth semiconductor layer of the first conductivity type has an impurity concentration of about $1 \times 10^{14}$ $cm^{-3}$ or more in a portion contacting the first semiconductor layer of the first conductivity type.

3. A semiconductor device according to claim 1, wherein the fourth semiconductor layer of the first conductivity type has an impurity concentration of about $1 \times 10^{18}$ cm$^{-3}$ or less at an interface with the third semiconductor layer of the first conductivity type.

4. A semiconductor device according to claim 1, wherein a plurality of electrode leads having one of opposite polarities of the photosensitive section are provided in a periphery of the plurality of split regions of the photosensitive section.

5. A semiconductor device according to claim 1, wherein the first semiconductor layer of the first conductivity type has a higher impurity concentration than an impurity concentration of the semiconductor substrate of the first conductivity type.

6. A semiconductor device according to claim 1, wherein the second semiconductor layer of the first conductivity type has a lower impurity concentration than an impurity concentration of the first semiconductor layer of the first conductivity type.

7. A semiconductor device according to claim 1, wherein an impurity concentration distribution in the first semiconductor layer of the first conductivity type has a gradient.

8. A semiconductor device according to claim 1, further comprising a transistor formed on the semiconductor multilayer structure of the first conductivity type.

* * * * *